(12) United States Patent
Kasahara et al.

(10) Patent No.: US 7,766,733 B2
(45) Date of Patent: Aug. 3, 2010

(54) STORAGE CONTROL APPARATUS EQUIPPED WITH A LOGIC BOARD FOR CARRYING OUT STORAGE CONTROL

(75) Inventors: Yoshikatsu Kasahara, Ninomiya (JP); Kenichi Miyamoto, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 1164 days.

(21) Appl. No.: 11/215,000

(22) Filed: Aug. 31, 2005

(65) Prior Publication Data
US 2007/0006239 A1 Jan. 4, 2007

(30) Foreign Application Priority Data
Jul. 4, 2005 (JP) ............... 2005-194758

(51) Int. Cl.
  H05K 5/00 (2006.01)
  H05K 7/20 (2006.01)
  G06F 1/20 (2006.01)
(52) U.S. Cl. ............. 454/184; 361/679.48; 361/679.49; 361/695
(58) Field of Classification Search ................ 454/184; 361/679.48, 679.49, 695
See application file for complete search history.

(56) References Cited

U.S. PATENT DOCUMENTS

| | | | |
|---|---|---|---|
| 5,063,477 A | 11/1991 | Paggen et al. | |
| 5,414,591 A * | 5/1995 | Kimura et al. | 361/695 |
| 5,570,269 A * | 10/1996 | Korikawa et al. | 361/679.31 |
| 5,995,368 A * | 11/1999 | Lee et al. | 361/695 |
| 6,151,213 A * | 11/2000 | Ater et al. | 361/695 |
| 6,272,012 B1 * | 8/2001 | Medin et al. | 361/690 |
| 6,449,150 B1 * | 9/2002 | Boone | 361/694 |
| 6,597,571 B2 * | 7/2003 | Kubota et al. | 361/695 |
| 6,639,794 B2 * | 10/2003 | Olarig et al. | 361/679.48 |
| 6,951,513 B1 * | 10/2005 | Greenslade et al. | 454/184 |
| 2003/0151894 A1* | 8/2003 | Singer | 361/695 |
| 2004/0001311 A1* | 1/2004 | Doblar et al. | 361/687 |
| 2004/0184233 A1 | 9/2004 | Yamada | |
| 2004/0207966 A1* | 10/2004 | Lin et al. | 361/78 |
| 2004/0261089 A1 | 12/2004 | Nishiyama et al. | |
| 2005/0047084 A1 | 3/2005 | Kabat | |
| 2005/0141207 A1* | 6/2005 | Campini | 361/790 |
| 2005/0162830 A1* | 7/2005 | Wortman et al. | 361/695 |
| 2005/0286222 A1* | 12/2005 | Lucero et al. | 361/690 |
| 2006/0215363 A1* | 9/2006 | Shipley et al. | 361/695 |

* cited by examiner

Primary Examiner—Steven B McAllister
Assistant Examiner—Patrick F. O'Reilly, III
(74) Attorney, Agent, or Firm—Brundidge & Stanger, P.C.

(57) ABSTRACT

A storage control apparatus comprises a vertical logic board; and a cooling mechanism for cooling the logic board. This cooling mechanism is constituted such that air taken in from the front of the storage control apparatus travels to the rear side of the storage control apparatus and then rises up, this risen air rises further while cooling the vertical logic board, and the risen air is discharged from the rear of the storage control apparatus.

14 Claims, 15 Drawing Sheets

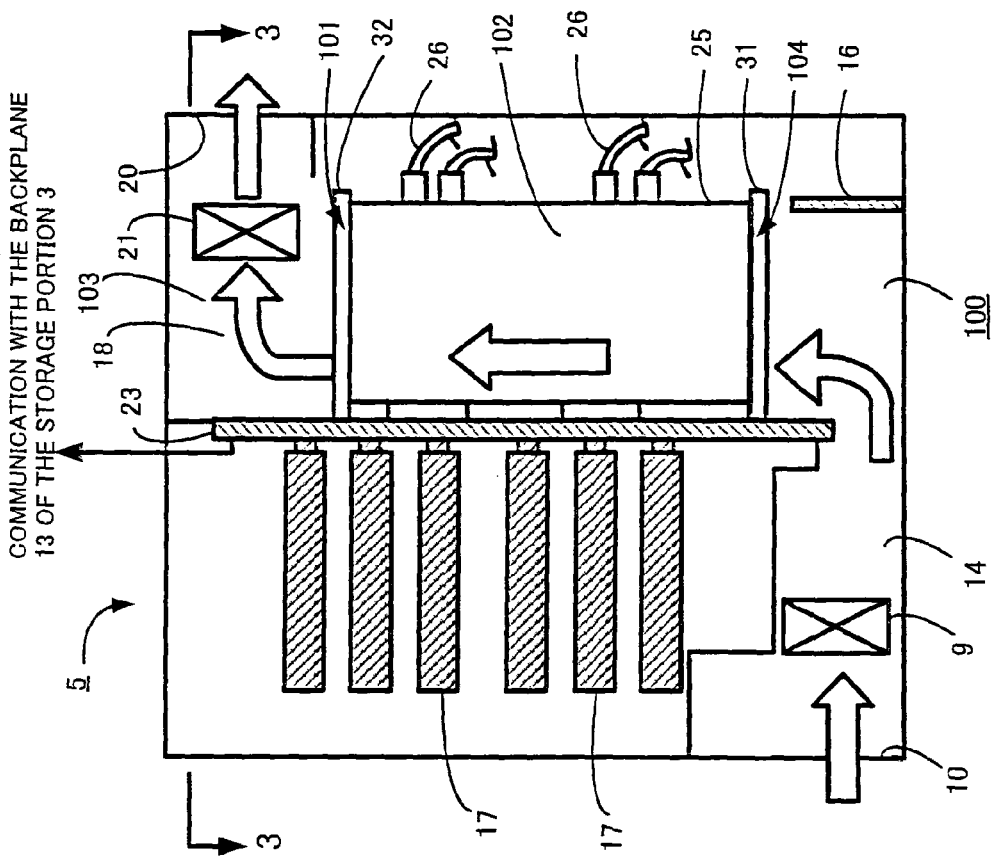
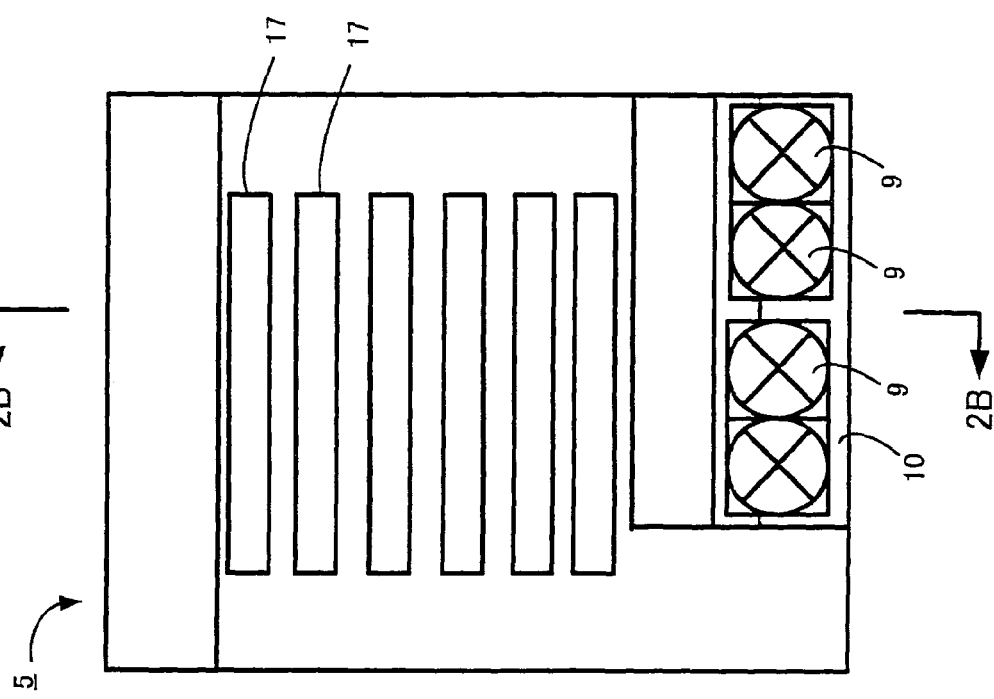

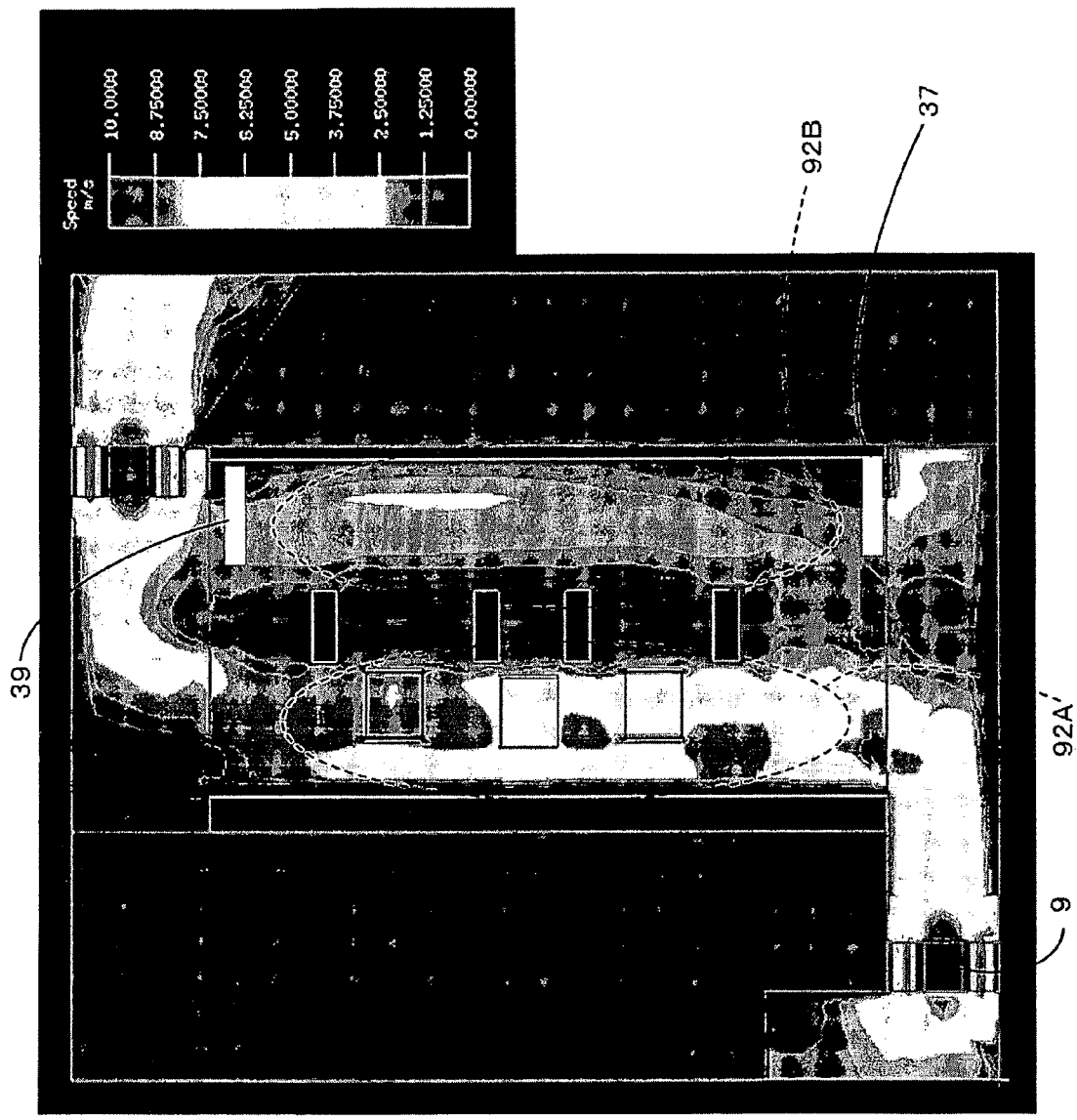

STORAGE CONTROL APPARATUS EQUIPPED WITH A LOGIC BOARD FOR CARRYING OUT STORAGE CONTROL

CROSS-REFERENCE TO PRIOR APPLICTION

This application relates to and claims priority from Japanese Patent Application No. 2005-194758, filed on Jul. 4, 2005, the entire disclosure of which is incorporated herein by reference.

1. Field of the Invention

The present invention relates to a storage control apparatus, and more particularly, to a cooling mechanism of a storage control apparatus.

2. Background of the Invention

For example, in a database system such as a data center, which handles huge amounts of data, a storage control apparatus constituted separately from the host computer is used to manage data. This storage control apparatus, for example, is a disk array device like a RAID (Redundant Array of Independent Inexpensive Disks), which is constituted by arranging a plurality of storage devices in an array.

As a cooling mechanism for a storage control apparatus such as this, for example, there is the cooling mechanism, which is capable of being applied to a storage device, disclosed in Japanese Laid-open Patent No. 2005-11405. That is, a long passageway is provided in the approximate center of a storage device in the vertical direction of the storage device, and a fan is mounted in the top of the storage device. Air is taken in from the bottom and rear side of the storage device, and the taken in air flows toward the center of the passageway as it cools the equipment inside the storage device, converging in the passageway. The converged air is drawn upward by the fan in the top of the storage device, and discharged to the outside via this fan.

SUMMARY OF THE INVENTION

For example, a storage control apparatus, which is equipped with a plurality of logic boards (for example, control boards mounted with processors and memory, or memory boards mounted with memory), and which carries out various processing using the equipped plurality of logic boards, is well known. In general, when trying to enhance the functionality of a storage control apparatus, it is necessary to equip it with high-functionality logic boards. A high-functionality logic board is larger in size than a low-functionality logic board. Consequently, in order to be able to equip a storage control apparatus with larger logic boards to enhance its functionality, it could be necessary to increase the size of the storage control apparatus as well.

Among storage control apparatuses having the same functions, a small storage control apparatus is considered preferable to a large storage control apparatus. However, if a cooling mechanism like the one described above is employed as the cooling mechanism of a storage control apparatus, a passageway for discharging air from the top of the storage control apparatus would have to be secured inside the storage control apparatus, thereby making it that much more difficult to achieve a small-size storage control apparatus.

Therefore, an object of the present invention is to provide a cooling mechanism that can contribute toward making a storage control apparatus compact.

Other objects of the present invention should become clear from the following disclosure.

A storage control apparatus according to a first aspect of the present invention comprises a vertical logic board, and a cooling mechanism for cooling the logic board. The above-mentioned cooling mechanism is constituted such that air taken in from the front of the above-mentioned storage control apparatus travels to the rear side of the above-mentioned storage control apparatus and then rises up, the above-mentioned risen air rises further as it cools the above-mentioned vertical logic board, and the above-mentioned risen air is discharged from the back of the above-mentioned storage control apparatus.

In one embodiment, the above-mentioned cooling mechanism can comprise an inlet provided in the front of the above-mentioned storage control apparatus; an outlet provided in the back of the above-mentioned storage control apparatus; and an air passageway from the above-mentioned inlet to the above-mentioned outlet. The above-mentioned air passageway can be constituted from a first air sub-passageway, which extends from the above-mentioned inlet to a position lower than the bottom edge of the logic board; a second air sub-passageway, which continues from the end of the first air sub-passageway to either a position at the top edge of the logic board or higher via the surface of the above-mentioned logic board; and a third air sub-passageway, which continues from the end of the second air sub-passageway to the above-mentioned outlet. In the above-mentioned second air sub-passageway, the part, which passes through the surface of the above-mentioned logic board, can substantially cover the entire surface of the above-mentioned logic board.

In one embodiment, the above-mentioned storage control apparatus can further comprise a backplane, which is a circuit board that divides the above-mentioned storage control apparatus into a front side and a rear side. The above-mentioned logic board can be connected to the above-mentioned backplane from the rear side of the above-mentioned storage control apparatus in a vertical state.

In one embodiment, the above-mentioned cooling mechanism can comprise an inlet provided in the front of the above-mentioned storage control apparatus; an outlet provided in the rear of the above-mentioned storage control apparatus; an air passageway, which continues from the above-mentioned inlet to the above-mentioned outlet; and at least one of an intake source, which is provided either in the above-mentioned inlet or in the vicinity thereof, for taking in air from the above-mentioned front, and an exhaust source, which is provided either in the above-mentioned outlet or in the vicinity thereof, for discharging air to the above-mentioned rear.

In one embodiment, the above-mentioned storage control apparatus can further comprise a velocity adjustment member for adjusting the velocity of the air at a specified location of the above-mentioned logic board.

For example, the above-mentioned velocity adjustment member is a velocity resistance member for suppressing the velocity of the air, and is located at the back side of the above-mentioned logic board (In other words, at the rear of the above-mentioned storage control apparatus), and can be provided in at least one of either a location that is higher than the top edge of the above-mentioned logic board, or a location that is lower than the bottom edge of the above-mentioned logic board. The "back side of the logic board", for example, is either the back side part of the logic board, or even further to the rear.

Also, for example, the above-mentioned velocity resistance member can also be a plate having one or a plurality of holes formed thereon.

Also, for example, the above-mentioned storage control apparatus can further comprise a positioning member for positioning the above-mentioned logic board. The above-mentioned velocity resistance member can also be mounted to the above-mentioned positioning member.

Also, for example, the above-mentioned velocity resistance member can also be a guiding member for causing the air traveling from the above-mentioned front to the above-mentioned rear of the storage control apparatus to rise up from a certain location toward the above-mentioned logic board. The above-mentioned guiding member can be mounted in the vicinity of the above-mentioned certain location at a prescribed height from the bottom of the passageway along which the air flows, and can thus be constituted such that the air from the above-mentioned front separates above and below the above-mentioned guiding member, and the air that separated upwardly rises toward the above-mentioned logic board, and the air that separated downwardly passes below the above-mentioned guiding member and travels further toward the above-mentioned rear. The above-mentioned prescribed height can be determined in accordance with the amount of at least one of the air of the upper side and the air of the lower side, which are divided by said guiding member.

Furthermore, the above-mentioned velocity adjustment member is not just a member for suppressing the velocity of the air (in other words, a member for slowing down the air velocity), but rather, for example, can also be a member for suppressing fluctuations in the air velocity at the surface of the logic board, and can also be a member for speeding up the air velocity relative to specified members of the logic board. As a member for speeding up the air velocity, for example, it can be a member comprising a hole, the cross-section of which becomes smaller in the direction in which the air is traveling. This member, for example, can be provided in a location such that the air moves at a faster rate for heat-generating members on the logic board (for example, processors) than for members other than heat-generating members.

In one embodiment, the above-mentioned storage control apparatus can further comprise multiplexed logical groups (For example, a plurality of clustered components comprising clusters). The respective logical groups can have one or more logic boards. Either a part or the whole of the passageway for the air, which is taken in from the front of the above-mentioned storage control apparatus and discharged from the rear of the above-mentioned storage control apparatus, can be partitioned of each of the above-mentioned logical groups (For example, it can be constituted like the fourth embodiment described hereinabove.).

In this embodiment, the above-mentioned cooling mechanism can comprise at least one of a plurality of intake sources for taking in air from the front of the above-mentioned storage control apparatus, and a plurality of exhaust sources for discharging air from the rear of the above-mentioned storage control apparatus. Each of the above-mentioned plurality of intake sources and/or the above-mentioned plurality of exhaust sources can correspond to at least one of the above-mentioned multiplexed logical groups. When trouble occurs in a certain logical group of the above-mentioned multiplexed logical groups, the above-mentioned storage control apparatus can halt the driving of the intake source and/or exhaust source corresponding to the above-mentioned certain logical group.

In one embodiment, the above-mentioned storage control apparatus can further comprise multiplexed logical groups. Each logical group can have one or more logic boards. The above-mentioned cooling mechanism can comprise at least one of a plurality of intake sources for taking in air from the front of the above-mentioned storage control apparatus, and a plurality of exhaust sources for exhausting air from the rear of the above-mentioned storage control apparatus. Each of the above-mentioned plurality of intake sources and/or the above-mentioned plurality of exhaust sources can correspond to at least one of the above-mentioned multiplexed logical groups. Even when trouble occurs in a certain logical group of the above-mentioned multiplexed logical groups, the above-mentioned storage control apparatus can keep driving the intake source and/or exhaust source corresponding to the above-mentioned certain logical group.

A storage control apparatus according to a second aspect of the present invention comprises a backplane, which is a circuit board that divides the above-mentioned storage control apparatus into a front side and a rear side; a logic board which is connected to the above-mentioned backplane in a vertical state from the rear side of the above-mentioned storage control apparatus; and a cooling mechanism for cooling the above-mentioned logic board. The above-mentioned cooling mechanism comprises an inlet provided in the front of the above-mentioned storage control apparatus; an outlet provided in the rear of the above-mentioned storage control apparatus; at least one of an intake source, which is provided either in the above-mentioned inlet or in the vicinity thereof, for taking in air from the above-mentioned front, and an exhaust source, which is provided either in the above-mentioned outlet or in the vicinity thereof, for discharging air to the above-mentioned rear; and an air passageway, which extends from the above-mentioned inlet to the above-mentioned outlet. The above-mentioned cooling mechanism is constituted such that air taken in from the above-mentioned inlet travels to the rear side of the above-mentioned storage control apparatus and then rises up, the above-mentioned risen air rises further as it cools the above-mentioned vertical logic board, and the risen air is discharged from the above-mentioned outlet.

Either of the storage control apparatuses described hereinabove, for example, can be an apparatus, which furnishes a storage disk, and a logic board for controlling either writing to or reading from this storage disk, and, for example, can also be the above-mentioned logic portion itself without a storage disk.

BRIEF DESCRIPTION OF THE DRAWINGS

FIG. 2A shows a schematic of the front of a logic portion 5;

FIG. 2B shows a schematic of a cross-section 2B-2B of the logic portion 5 of FIG. 2A;

FIG. 8 shows an example of analysis results of the velocity distribution of the air flowing inside a logic portion 5A in the second embodiment;

DETAILED DESCRIPTION OF THE PREFERRED EMBODIMENTS

A number of embodiments of the present invention will be explained below by referring to the figures.

First Embodiment

Figure 1:
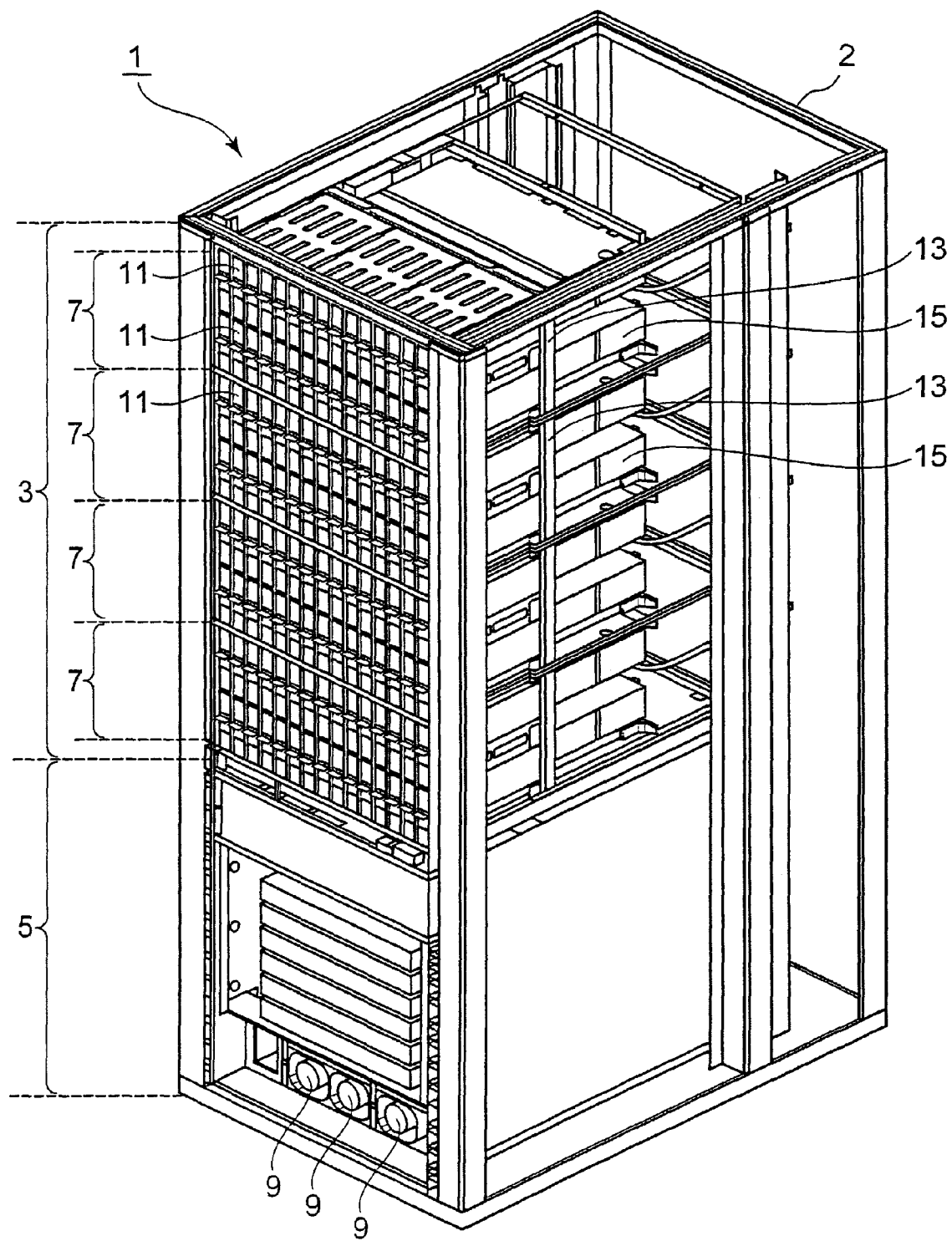
FIG. 1 shows a schematic of the outside of a storage control apparatus related to a first embodiment of the present invention.

FIG. 1 shows a schematic of the outside of a storage control apparatus related to a first embodiment of the present invention. However, to make it somewhat easier to understand the constitution of the inside of this storage control apparatus 1, the top and side have been made transparent.

The storage control apparatus 1 is a rack-mounted apparatus, and can be constructed by mounting various components to a rack 2. The rack 2 is in the shape of an approximate rectangular parallelepiped, and has a width of the length stipulated by a prescribed standard (for example, an EIA standard). The height and depth dimensions of the rack 2 do not have to be regulated.

A plurality of parts can be provided in a stacked state in the rack 2. For example, a logic portion 5, on which logic boards not shown in the figure are mounted, can be provided on the bottommost tier of the rack 2. Another part can be provided on the layer immediately above the logic portion 5. As this other part, there can be another logic portion, but in this embodiment, there is provided a storage portion 3, to which a plurality of storage devices 11 are mounted.

The storage portion 3 and logic portion 5 will be explained in detail below. First, the storage portion 3 will be explained in detail.

The storage portion 3 is constituted from a plurality of sub-storage portions 7. The respective sub-storage portions 7 comprise a backplane 13, which partitions the sub-storage portion 7 into a front side (in other words, the foreground side) and a rear side (in other words, the background side). A backplane 13 can be used to divide an individual sub-storage portion 7, or it can be common to a plurality of sub-storage portions 7. The backplane 13, for example, is a kind of circuit board on which wiring patterns are printed. Two or more storage devices 11, which are arranged in the cross direction of the rack 2, are connected to the front of the backplane 13, and a power source unit 15, which constitutes the power source of the storage devices 11, is connected to the rear of the backplane 13. In this embodiment, the storage devices 11 are hard disk drives (for example, hard disk drives having fibre channel (FC), SATA (Serial ATA) or SAS (Serial Attached SCSI) interfaces), but variations are not limited to a hard disk drive, and an optional storage device, such as an optical disk drive (for example, a DVD drive), or magnetic tape drive, can be used.

As for the inside of the storage portion 3, for example, the respective storage devices 11 provided in the storage portion 3, although not shown in the figure in particular, for example, are cooled as follows. That is, there is a gap between each storage device 11 and the storage device 11 next to it in the cross direction mounted to the backplane 13. Holes (hereinafter, air holes) for allowing air to pass through are formed at a certain density in the backplane 13. A fan, which is not shown in the figure, is mounted to the power source unit 15 for taking air in from the front side and discharging air to the rear side. By driving this fan, air is taken in from the front of the rack 2, and by passing through the gaps between the storage devices 11, the taken in air cools the storage devices 11, and the air that passed through the gaps of the storage devices 11 passes through the air holes formed in the backplane 13, and is discharged to the rear side of this backplane 13 via the power source unit 15. Thus, the inside of the storage portion 3 is cooled by air flowing directly from the front to the rear of the storage portion 3.

Next, the logic portion 5 will be explained.

Figure 3:
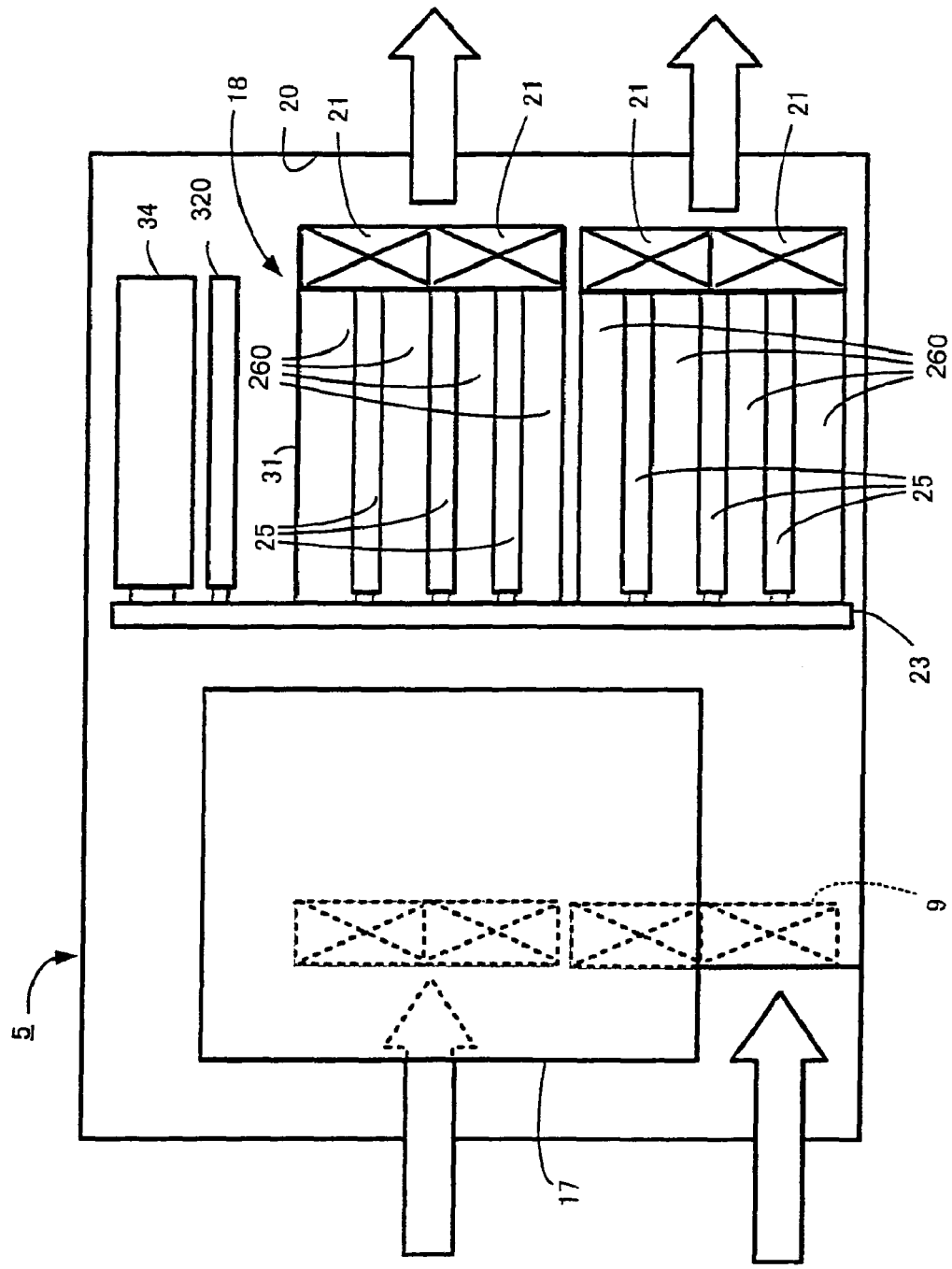
FIG. 3 shows a schematic of a cross-section 3-3 of the logic portion 5 of FIG. 2B.

FIG. 2A shows a schematic of the front of a logic portion 5. FIG. 2B shows a schematic of a cross-section 2B-2B of the logic portion 5 of FIG. 2A. FIG. 3 shows a schematic of a cross-section 3-3 of the logic portion 5 of FIG. 2B.

There are bays in the front and rear of the logic portion 5 for mounting the components of the storage control apparatus 1. These bays, for example, are approximately rectangular, and are higher than they are wide.

The logic portion 5, as shown in FIGS. 2B and 3, is also divided into a front side and a rear side by a backplane 23. A plurality of battery units 17, which is arranged in the vertical direction of the rack 2, is connected to the front of this backplane 23.

An air inlet (hereinafter, inlet) 10, which extends in the cross-direction of the logic portion 5, is located in the bottom portion of the front of the logic portion 5 (for example, in the proximity of the front bottom edge), and a plurality of fans 9 (since these fans 9 are for taking in air, hereinafter, they will be called "intake fans 9"), which are arranged in the cross-direction of the logic portion 5, are mounted in the vicinity thereof (for example, slightly more toward the rear side than the inlet 10). Further, an air outlet (hereinafter, outlet) 20, which extends in the cross-direction of the logic portion 5, is located in the top portion of the rear of the logic portion 5 (for example, in the proximity of the rear top edge), and a plurality of fans 21 (since these fans 21 are for exhausting air, hereinafter, they will be called "exhaust fans 21"), which are arranged in the cross-direction of the logic portion 5, are mounted in the vicinity thereof (for example, slightly more toward the front side than the outlet 20). The number of intake fans 9 and exhaust fans 21 can either be the same or different. Further, it is not absolutely necessary that both intake fans 9 and exhaust fans 21 be provided; as long as at least one of these, the intake fans 9 or the exhaust fans 21, is provided, it is okay.

An air sub-passageway 14 extends from the inlet 10 of the logic portion 5 via the intake fans 9, and along the bottom of the logic portion 5 to the location of the backplane 23. Then, when the air sub-passageway 14 crosses to the rear side, there is a space 18, which runs from the bottom of the logic portion 5 to the top, and this space 18 connects to the outlet 20 by way of the exhaust fans 21. Further, there is a wall 16, which is designed to prevent air from passing further to the rear, disposed on the bottom of the logic portion 5 in the vicinity of the rear of the logic portion 5.

Figure 4:
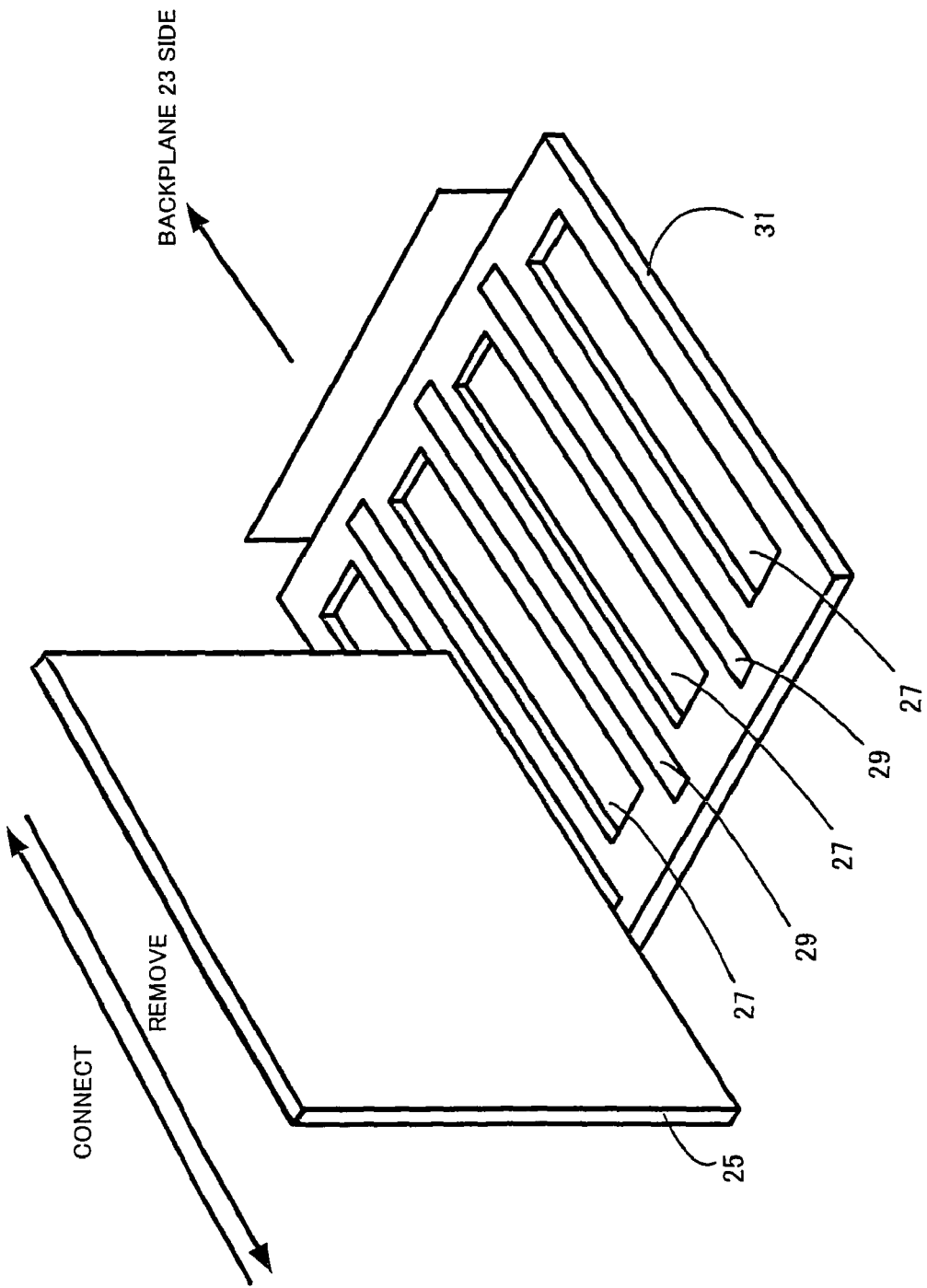
FIG. 4 is an example of the constitution of a board positioning plate 31.

The backplane 23 is connected so as to be able to communicate with the backplane 13 of the storage portion 3. A plurality of (or one) board positioning plates 31, 32 is attached in an approximately transverse direction (for example, substantially parallel to the bottom of the logic portion 5) to the rear of the backplane 23 as shown in FIGS. 2B and 3. More specifically, for example, there are an upper board positioning plate 32 and a lower board positioning plate 31, and logic boards 25 are sandwiched between the surface of the upper board positioning plate 32 and the surface of the lower board positioning plate 31. As shown in FIG. 4, logic board 25 guides (for example, a rail which extends in the lengthwise direction) 29 are disposed on the surfaces of the respective board positioning plates 32, 31. Each of the plurality of logic boards 25 is connected to the rear of the backplane 23 along guides 29 on the surfaces of the board positioning plates 31, 32. Thus, the respective logic boards 25 can access the storage devices 11 of the storage portion 3 via the backplanes 23 and 13. Furthermore, in this embodiment, the logic boards 25 are attached in a vertical state, in other words, such that the face of a logic board 25 is substantially perpendicular to the bottom of the logic portion 5 as shown in FIG. 2B. A logic board 25 can be either a control board equipped with a processor and a memory, or a memory board equipped with memory (for example, a board that functions as cache memory). For example, a connector for connecting to the backplane 23 is provided on the front end of a logic board 25, and, for example, a port for attaching a communication cable 26 or the like is provided on the back end of the logic board 25. A logic board 25 can be either a single circuit board, or can be constituted from a plurality of circuit boards in a stacked state.

One part of the space 18 is occupied by a plurality of logic boards 25. On both sides of the respective logic boards 25 there are narrow air passages (hereinafter, called "narrow passageways" for convenience sake) 260 arranged in the cross-direction of the logic portion 5. The narrow passageways 260 cover substantially the entire area of the surfaces of a logic board 25. As illustrated in FIG. 4, through-holes (for example, rectangular holes, which extend in the lengthwise direction) 27 are provided on both sides of the guides 29 in the board positioning plates 31, 32 leading to the narrow passageways 260 from the backside of the plates 31, 32.

The air sub-passageway 14 can be designed such that the cross-sectional area of a prescribed location of the air sub-passageway 14 (the cross-sectional area when this sub-passageway 14 is cut along the vertical direction of the logic portion 5) S1 is as wide as the area through which air passes into the space 18 (the area when this sub-passageway 14 is cut along the cross direction of the logic portion 5) S2. More specifically, for example, the air sub-passageway 14 can be designed such that $S1 \geqq S2$, or S1 is approximately equivalent to S2. Furthermore, the area S2, for example, is the total area remaining of the cross-sectional area S3 of the space 18 occupied by the logic boards 25 and so forth. The area S2, for example, can be calculated based on the type of mounted logic boards 25 using the formula cross-sectional area S3×X (where X is a value, for example 0.6, stipulated on the basis of the type of logic boards 25).

In addition, as shown in FIG. 3, an environment monitor unit 320 is connected to the backside of the backplane 23. The environment monitor unit 320, for example, is a kind of circuit board, and comprises a processor and a memory. The environment monitor unit 320, for example, can control the driving force (for example, the revolutions per unit of time) of at least one of the types of fans, the intake fans 9 or exhaust fans 21. More specifically, for example, the environment monitor unit 320 receives a signal for specifying the temperature from a temperature sensor (not shown in the figure) for detecting the temperature at a specified location inside the space 18, and based on this signal, can control the driving force of at least one of the types of fans, either the intake fans 9 or the exhaust fans 21.

In addition, as shown in FIG. 3, a plurality of power source units 34 arranged in the vertical direction of the logic portion 5 is connected to the backside of the backplane 23. The logic boards 25 and environment monitor unit 320 can be driven by power supplied from the power source units 34.

In accordance with the constitution of the above-described logic portion 5, the following cooling mechanism is constructed inside the logic portion 5. That is, there is an inlet 10 provided in the front of the logic portion 5; an outlet 20 provided in the rear of the logic portion 5; and an air passageway 100 connecting from the inlet 10 to the outlet 20. This air passageway 100 is constituted by a first air sub-passageway 14, which extends from the inlet 10 to a location lower than the bottom edge 104 of the logic boards 25; a second air sub-passageway 102, which continues from the back end of the first air sub-passageway 14 to a location at the top edge 101 of the logic boards 25 (or a location higher than this) by way of the surfaces of the logic boards 25; and a third air sub-passageway 103, which continues from the back end of the second air sub-passageway 102 to the outlet 20. Intake fans 9 are provided in the vicinity of the inlet 10, and exhaust fans 21 are provided in the vicinity of the outlet 20.

Air is taken in by the intake fans 9 via the inlet 10, and the air taken in by the intake fans 9 flows to the rear side via the first air sub-passageway 14. The air that flows beyond the first air sub-passageway 14 hits a wall 16, or rises up without hitting the wall 16. In other words, the traveling direction of the air inside the first air sub-passageway 14 is toward the rear side (in other words, in the lengthwise direction) along the first air sub-passageway 14, and curves upwards at a place beyond the first air sub-passageway 14.

The air that exits the first air sub-passageway 14 and rises upward ascends further upward along the second air sub-passageway 102 (more specifically, via the holes 27 in the board positioning plate 31 and along the narrow passageways 260). That is, the air that rises from the vicinity of the bottom of the logic portion 5 rises further through the narrow passageways 260 as it cools the logic boards 25. In the vicinity of the exhaust fans 21, the traveling direction of the air, whose temperature has risen as a result of cooling the logic boards 25, is made to curve toward the rear side by the exhaust fans 21. The air, whose traveling direction has been made to curve, is discharged via the exhaust fans 21 to the outside of the logic portion 5 from the outlet 20 (that is, from the rear of the logic portion 5). In other words, the air that travels beyond the second air sub-passageway 102 is discharged from the outlet 20 via the third air sub-passageway 103.

Furthermore, the image of the flow of air is schematically depicted in FIG. 2B, but this is a diagram designed to aid in understanding the explanation of this embodiment, and the air does not necessarily flow exactly in this manner.

Figure 5:
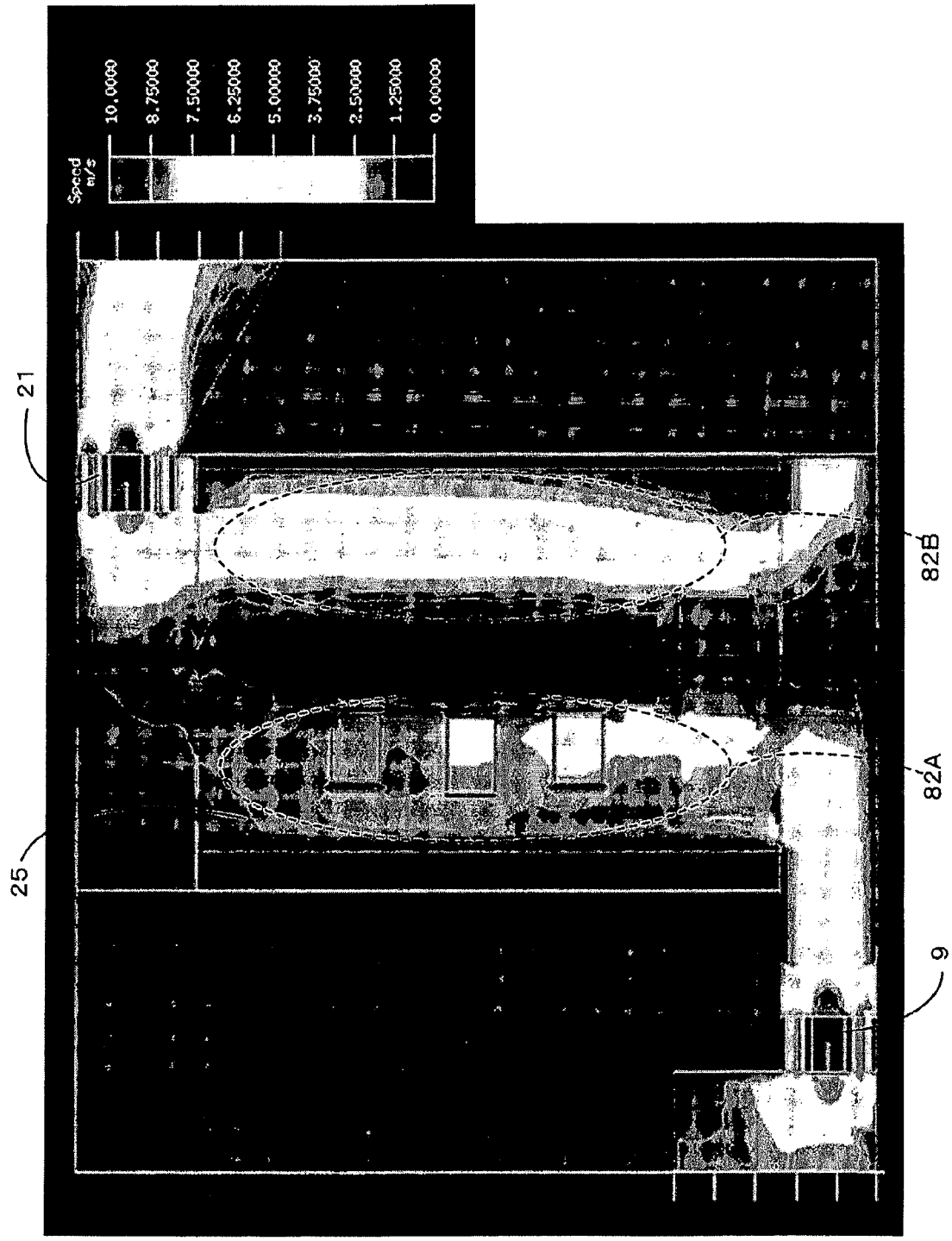
FIG. 5 shows an example of analysis results of the velocity distribution of the air flowing inside a logic portion 5 in the first embodiment.

FIG. 5 shows an example of the results of analysis of the velocity distribution of the air flowing inside the logic portion 5 in the first embodiment.

For example, by properly selecting the types of intake fans 9 and/or exhaust fans 21 to be installed, and the number of intake fans 9 and/or exhaust fans 21 to be installed, it is possible to make air flow at a favorable velocity (for example, a velocity of approximately two meters per second) around the heat-generating members on the logic boards 25 (for example, the squares inside the dotted line 82A) like the analysis results example. A processor, for example, is a heat-generating member.

Further, according to this example of analysis results, the velocity becomes higher toward the rear side of the logic boards 25, designated by dotted line 82B, than the front side, designated by dotted line 82A. Therefore, according to this example, for the logic board s 25, it is considered preferable to provide heat-generating members toward the back part rather than the front part (part on the backplane 23 side) of the logic boards 25 for cooling efficiency.

The preceding has been an explanation of the first embodiment.

For example, in a rack-mounted storage control apparatus, a plurality of parts are in a stacked state, and other parts are placed on top of the logic portion 5 at this time. Further, for example, there can also be situations in which a single storage device system can be provided by arranging a plurality of rack-mounted storage control apparatuses in the cross-direction. Therefore, to assure a certain degree of freedom of configuration, it is considered undesirable to provide the inlet and outlet on top of the logic portion 5, or to the right and left of the logic portion 5. According to this first embodiment, the inlet 10 is provided at the front of the logic portion 5, and the outlet 20 is provided at the rear of the logic portion 5. Therefore, the degree of freedom of the configuration is not greatly hindered as described hereinabove.

Further, in a rack-mounted storage control apparatus, the width of the rack (more specifically, for example, the width of the bay of the logic boards 25 and other components) is determined by a prescribed standard. For a high-functionality logic board, a large, wide logic board is probably better. Therefore, if the logic boards can only be mounted horizontally, there could be situations in which high-functionality logic boards cannot be installed. According to this first embodiment, the height of the bay for installing the components is greater than the width, making it possible to install the logic boards 25 in a vertical state. Thus, since it is possible to install large, wide logic boards, it should be possible to increase the functionality of a small-sized storage control apparatus.

As a method for cooling the inside of the logic portion 5, for example, a method, whereby holes of an appropriate pitch and diameter are made in the backplane 23, and air taken in from the front of the logic portion 5 is discharged via the holes in the backplane 23 from the rear of the logic portion 5 while cooling the logic boards 25, is conceivable. However, making holes in the backplane 23 can restrict the wiring since the wiring has to avoid the parts where these holes have been made. Further, for example, being able to connect as many logic boards 25 as possible to backplanes 23 of the same width requires that the backplane 23 wiring be as high density as possible, but high-density wiring is not possible when holes are made in the backplane 23. Accordingly, in this first embodiment, the design is such that the logic boards 25 can be cooled without making holes in the backplane 23. More specifically, for example, the inlet 10 is provided in the lower portion of the logic portion 5, and the outlet 20 is provided in the upper portion of the logic portion 5. The air taken in from the inlet 10 travels toward the rear side to at least a location at the front end of the logic boards 25, and when the air goes beyond this location, it rises, and, while cooling the logic boards 25 mounted in a vertical state, rises yet further, travels toward the rear side in the vicinity of the height at which the outlet 20 is located, and is discharged to the outside of the logic portion 5 via the outlet 20. This makes it possible to carry out the cooling of the logic boards 25 without making holes in the backplane 23.

Second Embodiment

A second embodiment of the present invention will be explained below. The points of difference with the first embodiment will mainly be explained at this time, and the explanation of the points shared in common with the first embodiment will be simplified or omitted (The same will hold true for the third and subsequent embodiments explained hereinbelow.).

Figure 6:
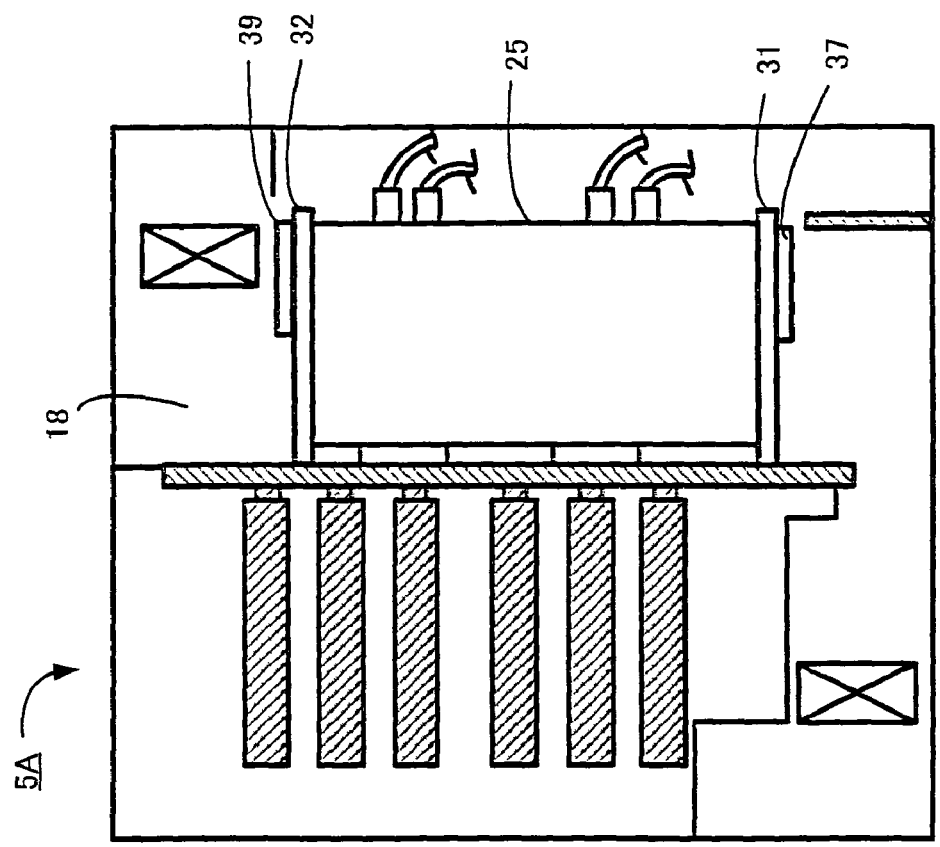
FIG. 6 shows a schematic of a cross-section of a logic portion 5A in a second embodiment of the present invention.

FIG. 6 shows a schematic of a cross-section of the logic portion 5A in the second embodiment of the present invention.

Resistance plates 37, 39 for suppressing the progress of the air are provided in the space 18 that exists on the rear side of the logic portion 5A. More specifically, for example, the resistance plates 37, 39 are provided rearward of the space 18. The resistance plate 39, for example, is mounted upwardly of the logic boards 25, for example, on the back side of the upper board positioning plate 32. By contrast, the resistance plate 37, for example, is mounted downwardly of the logic boards 25, more specifically, on the back side of the lower board positioning plate 31.

The resistance plates 37, 39, for example, are provided for suppressing a phenomenon such as that of the example of the results of analysis of the first embodiment illustrated in FIG. 5. More specifically, for example, they are provided to prevent the velocity at the rear side part from increasing and the velocity at the front side part from decreasing on both sides of the logic boards 25.

Figure 7:
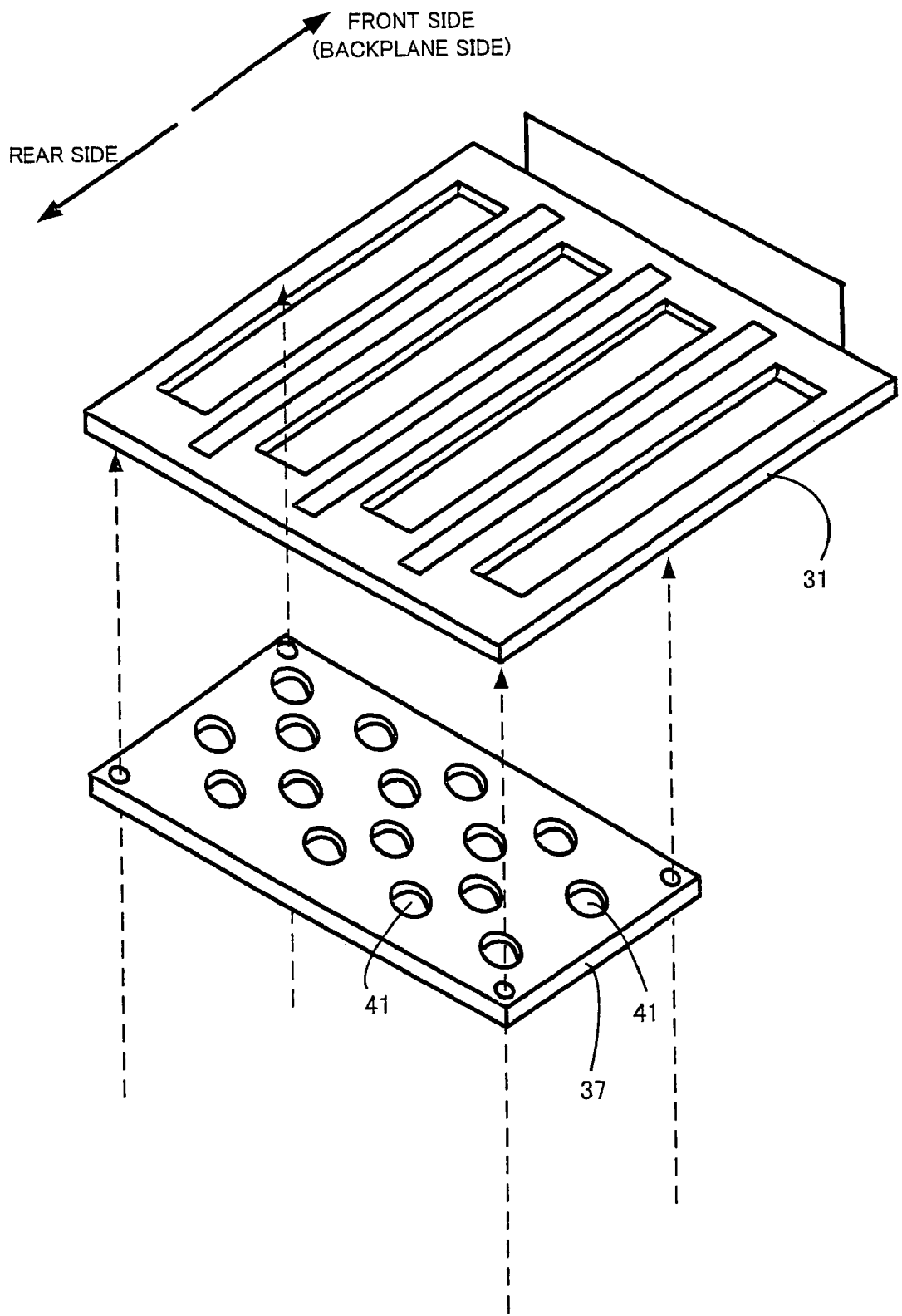
FIG. 7 shows an example of the constitution of a resistance plate 37, and one example of a method for mounting a resistance plate 37.

FIG. 7 shows an example of the constitution of the resistance plate 37, and one example of a method for mounting the resistance plate 37.

The resistance plate 37 can be used as a plate in which holes are made for the passage of air. More specifically, for example, the resistance plate 37 is punching metal. The design of the resistance plate 37, more specifically, for example, the area of the resistance plate 37, the diameter of the holes 41 made in the resistance plate 37, and the pitch from hole 41 to hole 41 can be designed on the basis of the results of analyzing the velocity and/or temperature inside the logic portion 5A.

The resistance plate 37, for example, as shown in FIG. 7, can be attached to the back side of the board positioning plate 31 with screws. Further, as for the location where it is attached with screws, it is desirable that this be the rear part of the board positioning plate 31 due to the fact that the resistance plate 37 is provided to prevent the velocity at the rear part of the logic boards 25 from becoming high.

The above explanation for the resistance plate 37 and its mounting method therefor can also be applied to the resistance plate 39 and the mounting method therefor.

FIG. 8 shows an example of results of analysis of the velocity distribution of air flowing inside the logic portion 5A in the second embodiment.

According to this example of analysis results, by providing the resistance plates 37, 39 in the above-mentioned locations in the logic portion 5A, the velocity at the rear side represented by dotted line 92B shown in FIG. 8 can be slowed down more than at the rear side represented by dotted line 82B shown in FIG. 5 (the rear part of the logic boards 25). Then, in accordance therewith, the velocity at the front side represented by dotted line 92A shown in FIG. 8 can be speeded up more than at the front side represented by dotted line 82A shown in FIG. 5 (the front part of the logic boards 25).

Thus, for example, as shown in FIG. 8, when the heat-generating members (for example, the squares inside the dotted line 92A) are located in the front part of the logic boards 25 when the logic boards 25 are attached, these members can be cooled better than in the case of the first embodiment. In other words, in accordance with where the heat-generating members (in other words, the cooling-targeted members) are located on the logic boards 25 when the logic boards 25 are attached can determine whether or not the resistance plates 37, 39 will be mounted, or where the resistance plates 37, 39 should be provided.

Further, since this can improve the cooling efficiency of the logic boards 25, the driving force of the intake fans 9 and/or exhaust fans 21 (for example, the number of revolutions per unit of time) can be held down more than in the first embodiment. By so doing, the noise from the intake fans 9 and/or exhaust fans 21 can be suppressed.

Figure 9A:
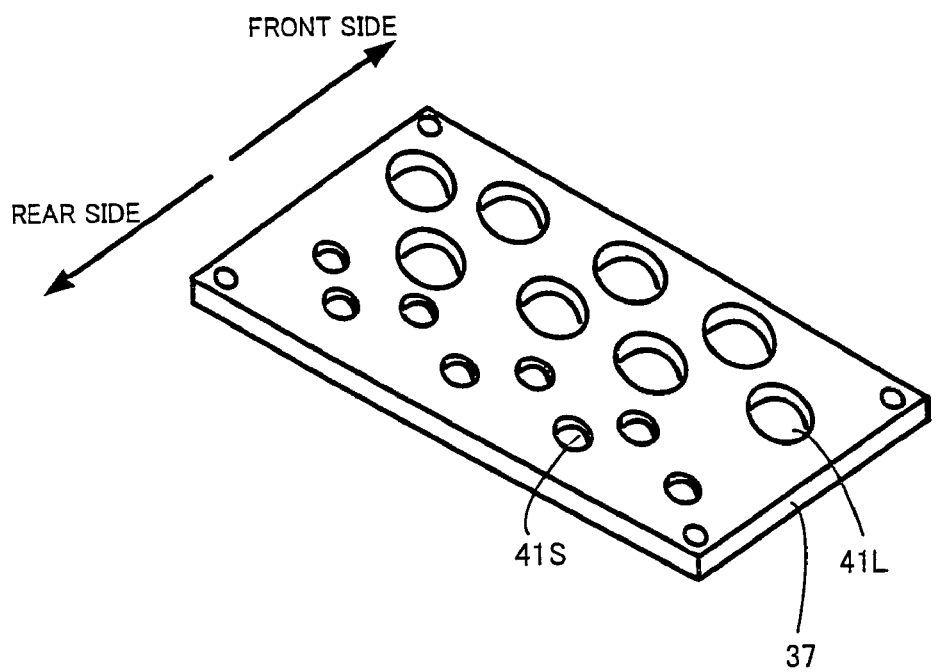
FIG. 9A shows a variation of a resistance plate 37.
Figure 9B:
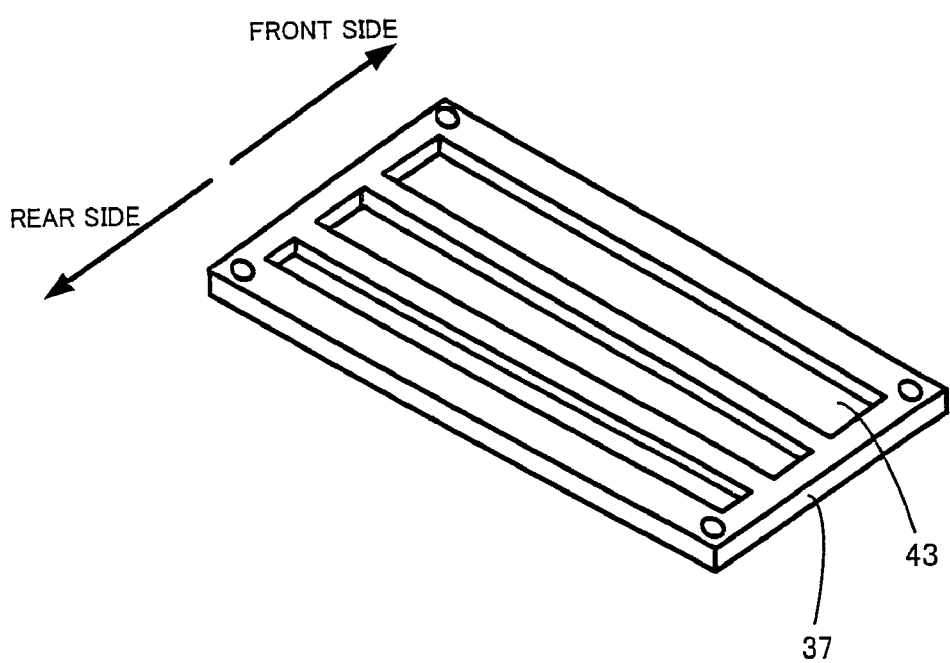
FIG. 9B shows another variation of a resistance plate 37.

The preceding was an explanation of the second embodiment. Furthermore, from the standpoint of suppressing the velocity at the rear part of the logic portion 5A in this second embodiment, the resistance plate 37 (and/or 39), for example, can be constituted as follows. That is, as illustrated in FIGS. 9A and 9B, holes can be made such that the total area of the holes decreases from the front to the rear of the resistance plate 37. More specifically, for example, as illustrated in FIG. 9A, large diameter holes 41L can be made in the front of the resistance plate 37, and holes 41S with diameters smaller than those can be made in the rear. Further, for example, as illustrated in FIG. 9B, a plurality of slits 43, which are arranged from the front of the resistance plate 37 to the rear, and which extend in the cross-direction of the resistance plate 37, can be provided, and the widths of the plurality of slits 43 can become narrower toward the rear.

Third Embodiment

Figure 10A:
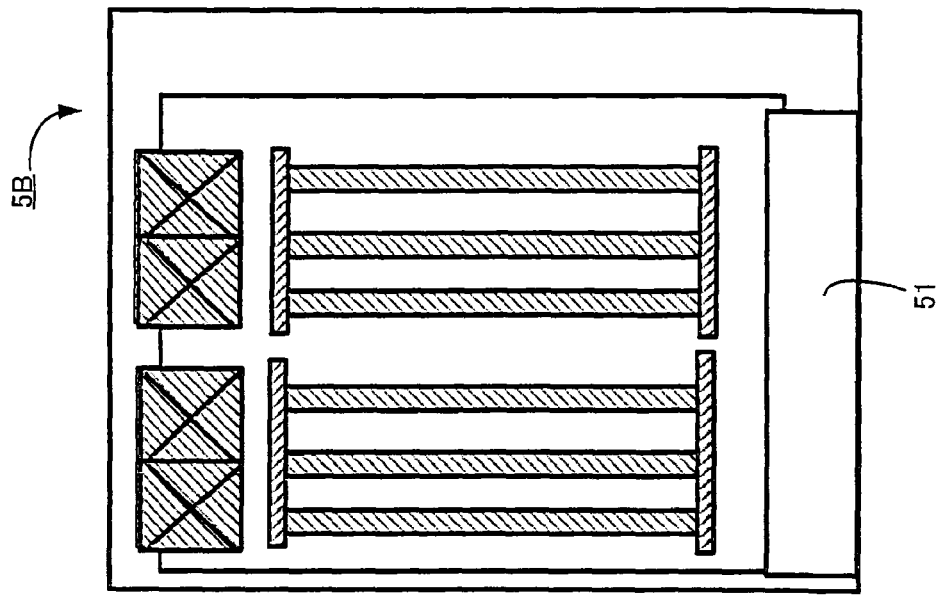
FIG. 10A shows a schematic of a cross-section of a logic portion 5B in a third embodiment of the present invention.
Figure 10B:
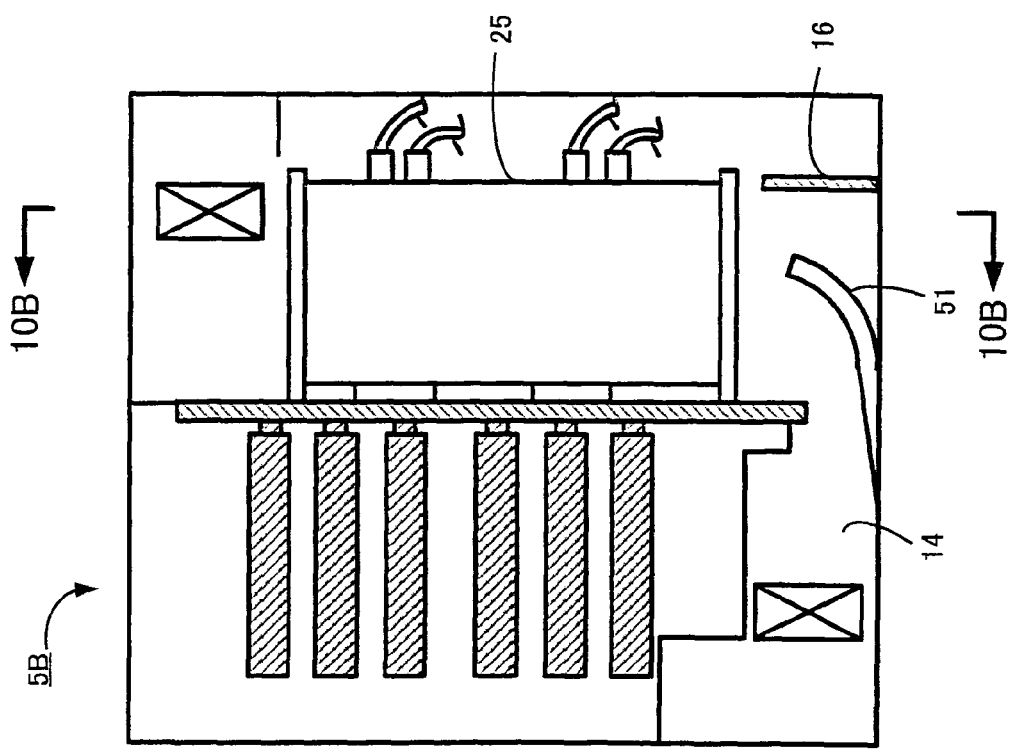
FIG. 10B shows a schematic of a cross-section 10B-10B of the logic portion 5B of FIG. 10A.

FIG. 10A shows a schematic of a cross-section of the logic portion 5B in a third embodiment of the present invention. FIG. 10B shows a schematic of a cross-section 10B-10B of the logic portion 5B of FIG. 10A.

A wind-direction guide 51 for guiding the progress of the air is provided in a certain location on the bottom of the logic portion 5B. The wind-direction guide 51, for example, is wide enough to at least cover the length of the plurality of logic boards 25 lined up in the cross-direction of the logic portion 5B as shown in FIG. 10B. Further, the wind-direction guide 51 is inclined so that the air exiting the air sub-passageway 14 rises smoothly prior to reaching the wall 16. This incline can be a flat surface, and can also be a curved surface as shown in FIG. 10A.

In accordance with this wind-direction guide 51, the air exiting the air sub-passageway 14 can cool the logic boards 25 by rising up at an appropriate location prior to hitting the wall 16. Further, it is possible to suppress the velocity at the rear part of the logic boards 25.

Furthermore, the following wind-direction guide can be employed as a variation of the third embodiment of the present invention.

Figure 11A:
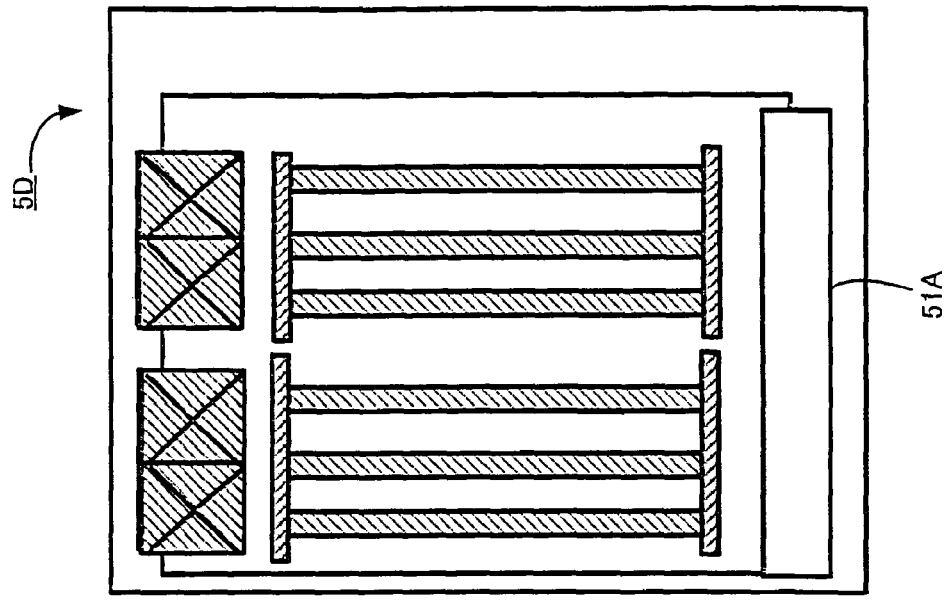
FIG. 11A shows a schematic of a cross-section of a logic portion 5D in a variation of the third embodiment of the present invention.
Figure 11B:
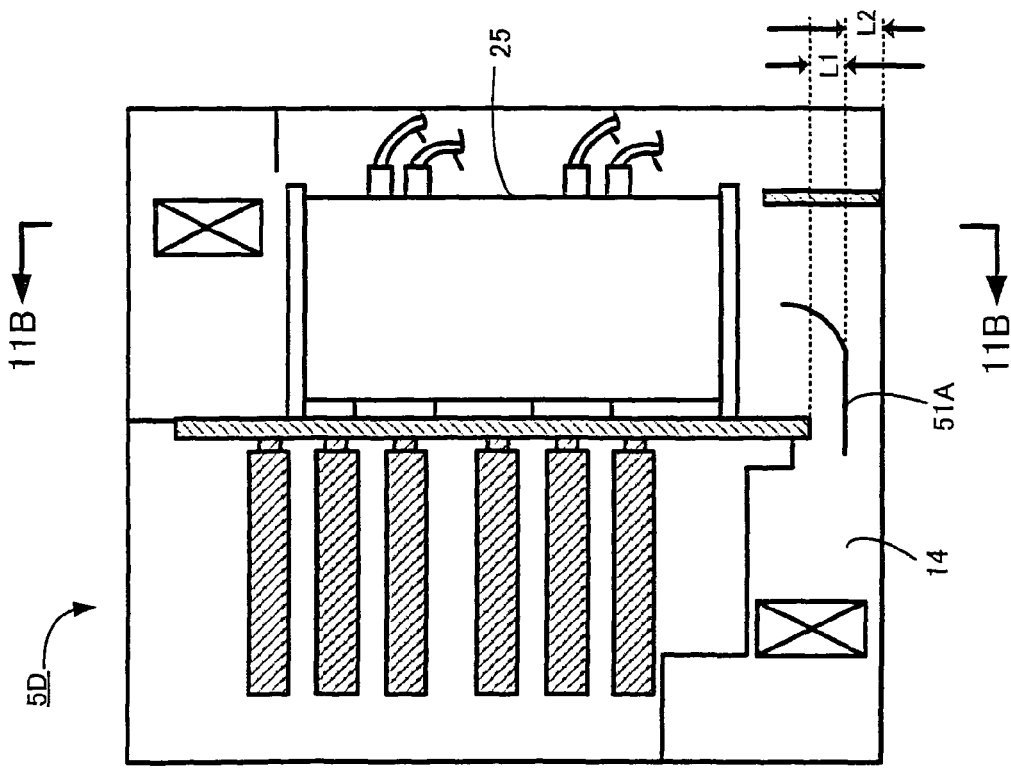
FIG. 11B shows a schematic of a cross-section 11B-11B of the logic portion 5D of FIG. 11A.

FIG. 11A shows a schematic of a cross-section of the logic portion 5D in one variation of the third embodiment of the present invention. FIG. 11B shows a schematic of a cross-section 11B-11B of the logic portion 5D of FIG. 11A.

As shown in these figures, the wind-direction guide 51A is provided in a passageway on the bottom side of the logic portion 5D at a height that is no more than a predetermined distance L2 from the bottom (without designating a particular mounting member for the wind-direction guide 51A). That is, the wind-direction guide 51A is mounted so as to divide the passageway on the bottom side of the logic portion 5D into an upper passageway and a lower passageway. The ratio of the height L2 of the lower passageway (for example, the ratio of L2 to the height L1 of the upper passageway) can be determined in accordance with how much air is to flow to the rear part of the logic boards 25 via the lower passageway.

Fourth Embodiment

Figure 12A:
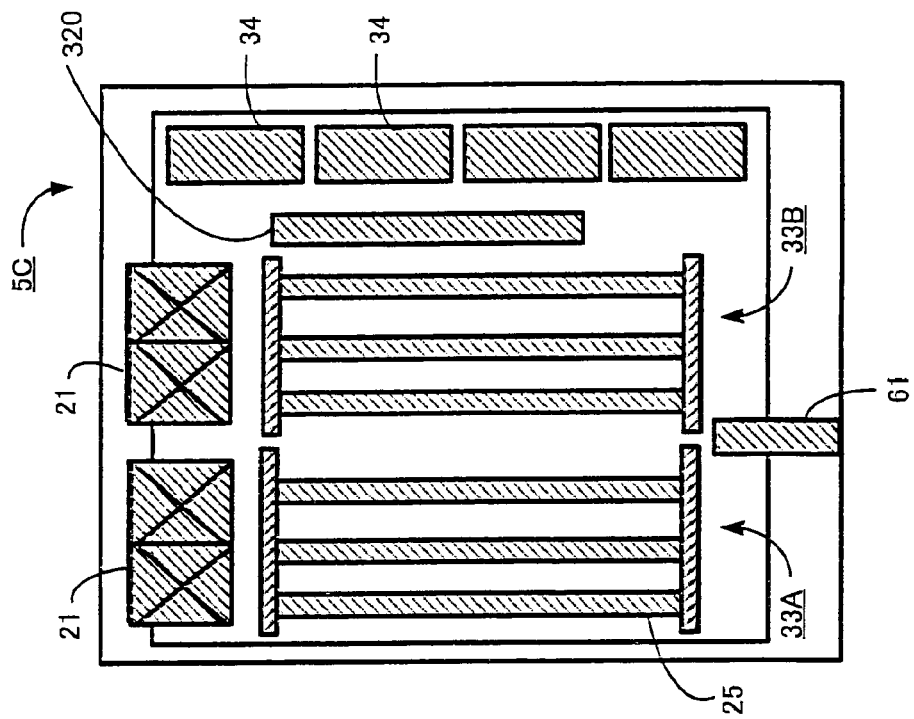
FIG. 12A shows a schematic of a cross-section of a logic portion 5C in a fourth embodiment of the present invention.
Figure 12B:
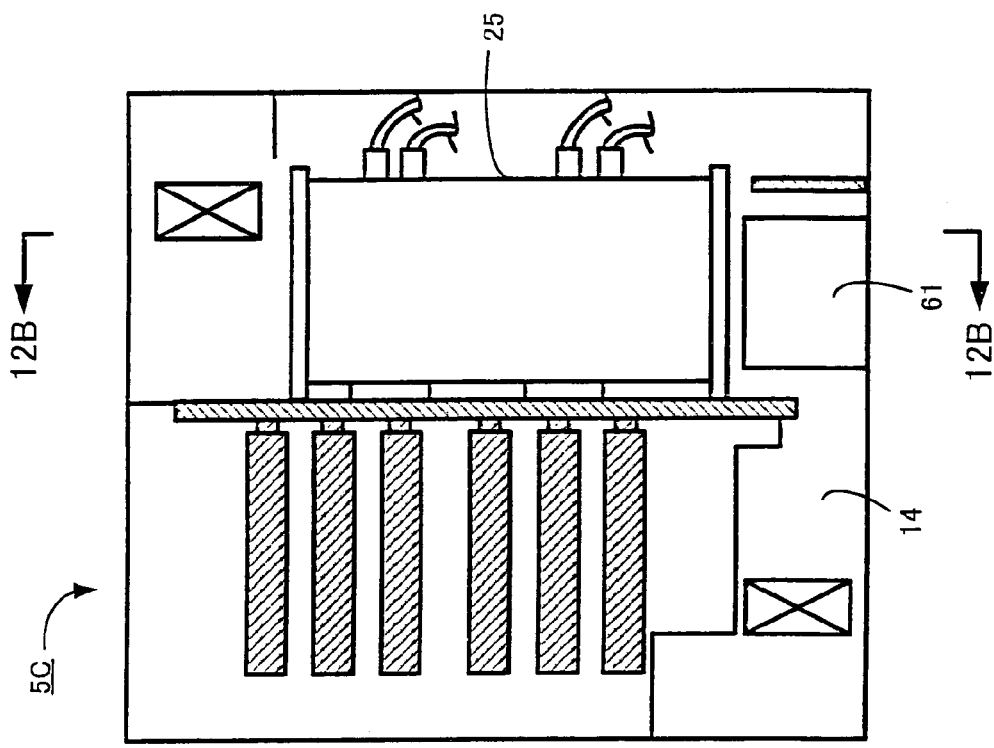
FIG. 12B shows a schematic of a cross-section 12B-12B of the logic portion 5C of FIG. 12A.

FIG. 12A shows a schematic of a cross-section of the logic portion 5C in a fourth embodiment of the present invention. FIG. 12B shows a schematic of a cross-section 12B-12B of the logic portion 5C of FIG. 12A.

A plurality of logic boards 25 mounted in the logic portion 5C is made into a cluster comprising two clustered elements 33A, 33B. For example, one clustered element 33A comprises half the number of logic boards 25 (The same holds true for 33B). In other words, the control system is duplexed in accordance with the clustered elements 33A and 33B. The clustered elements 33A and 33B can carry out exactly the same processing. For example, when trouble occurs in clustered element 33A and it closes down, clustered element 33B continues the processing that clustered element 33A had been doing in place of clustered element 33A.

Half of the plurality of intake fans 9 and half of the plurality of exhaust fans 21 support the one clustered element 33A, and the remaining half of each of these fans supports the other clustered element 33B. In other words, a single clustered element 33A, 33B is supported by two or more intake fans 9 and two or more exhaust fans 21.

Further, an air partitioning plate 61 is provided at the bottom of the logic portion 5C at the boundary location between the clustered elements 33A and 33B. The length of the partitioning plate 61 in the lengthwise direction, for example, is substantially the same length as the length of the logic boards 25 in the lengthwise direction. By arranging a partitioning plate 61 in this manner, the flow of air can be directed to each of the clustered elements 33A, 33B separately. Furthermore, in order to divide the flow of air more distinctly, the height of the partitioning plate 61 can exceed the height of the board positioning plate 31, and, in addition, can be the height of the exhaust fans 21, or thereabouts.

Figure 13:
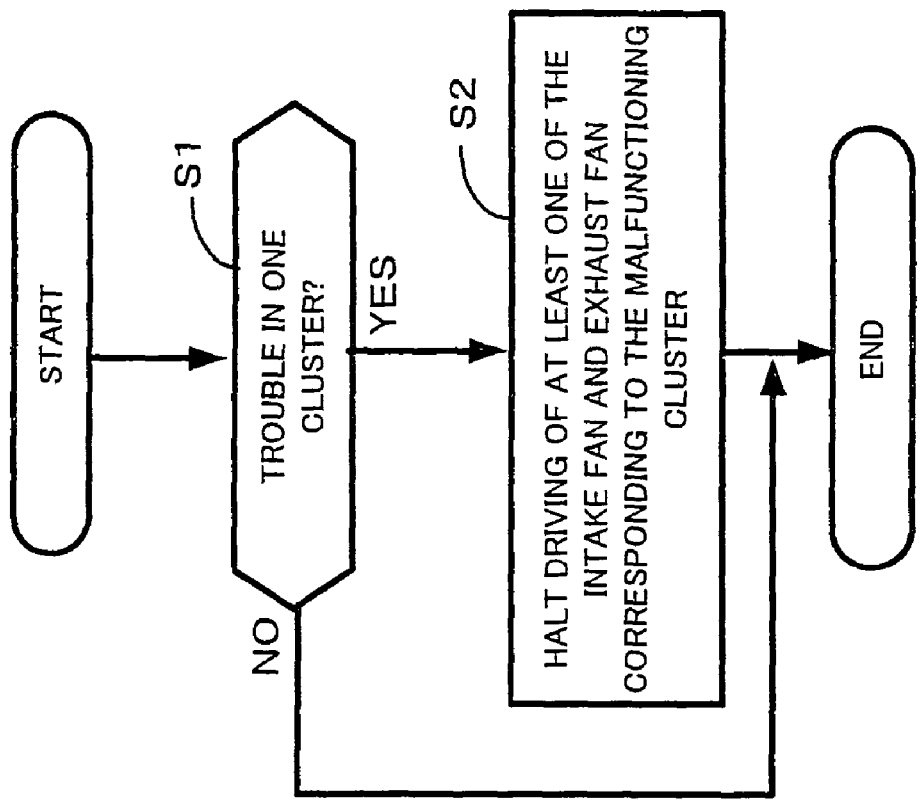
FIG. 13 is a schematic diagram of one example of cooling control in the fourth embodiment of the present invention.

In accordance with the above-mentioned constitution, the velocity around the logic boards 25 can be controlled separately for each clustered element 33A, 33B. More specifically, for example, as shown in FIG. 13, when the one clustered element 33A malfunctions (for example, when a malfunction occurs in a logic board 25 of clustered element 33A) (Step S1: YES), the driving of at least one of the intake fans 9 and exhaust fans 21 supporting this clustered element 33A can be stopped (S2). This stoppage, for example, can be hardware-based and carried out by virtue of the circuit design, or it can be software-based and carried out by the processor inside the environment monitoring unit 320.

According to this fourth embodiment, the provision of a partitioning plate 61 makes it possible to separately control cooling for the clustered elements 33A, 33B. This is because, for example, when trouble occurs in the one clustered element 33A, even if the driving of the intake fans 9 and/or exhaust fans 21 supporting this are stopped, the other clustered element 33B can be cooled via the intake fans 9 and/or exhaust fans 21 supporting it.

Furthermore, in this fourth embodiment, the partitioning plate 61, for example, can be provided not only in the rear of the logic portion 5C, but also, for example, in the air sub-passageway 14. Further, it can also be provided between the clustered elements 33A and 33B.

Further, for example, from the standpoint of reducing the number of parts, the partitioning plate 61 does not necessarily have to be used.

Figure 14:
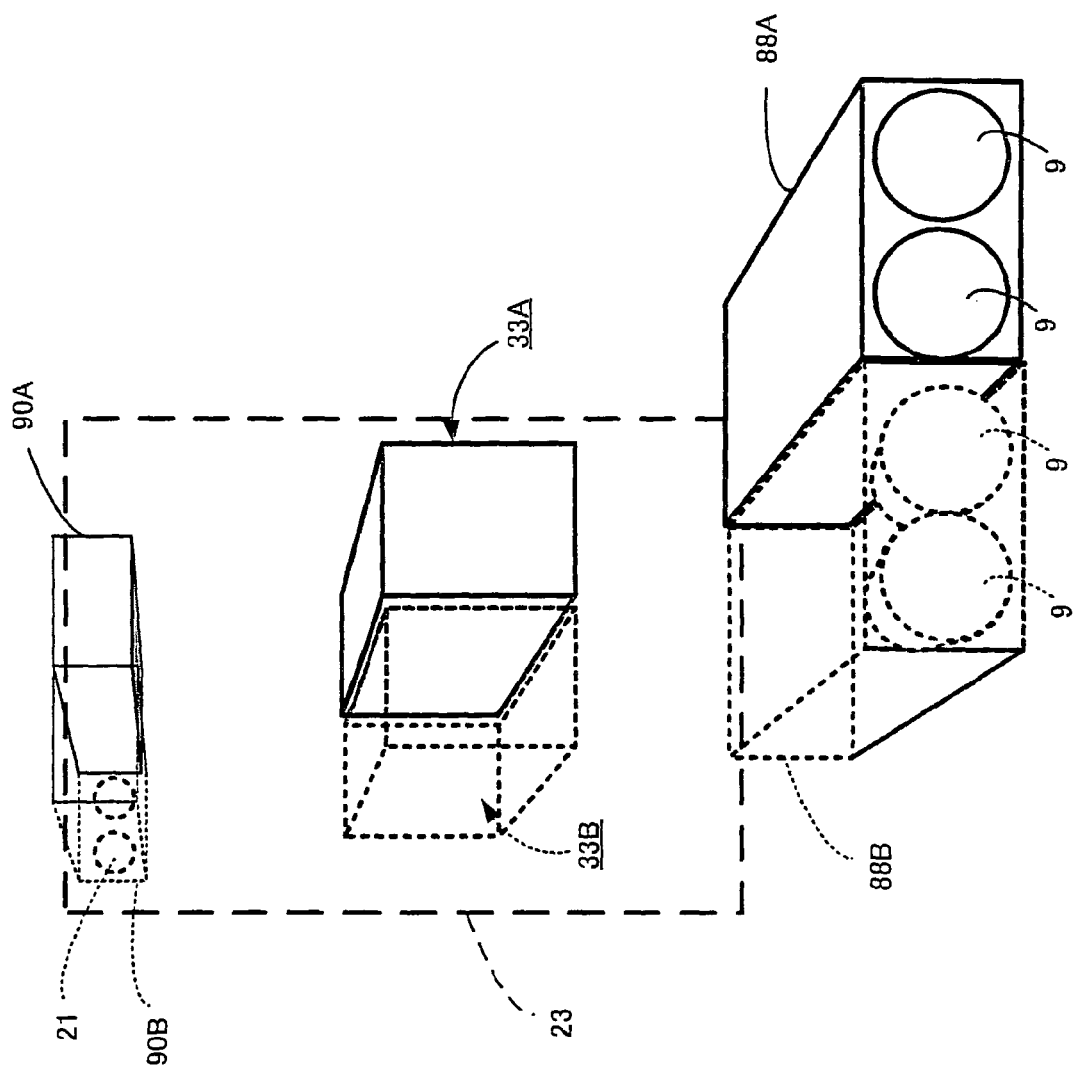
FIG. 14 is a schematic diagram of a cooling mechanism in a variation of the fourth embodiment of the present invention.

Further, for example, either in place of or in addition to the partitioning plate 61, the flow of air can be partitioned for each clustered element 33A, 33B by another method. For example, as shown in FIG. 14, the air passageway in at least one of the vicinity of the inlet or the vicinity of the outlet can be partitioned for each clustered element 33A, 33B. More specifically, for example, both (one is also okay) intake fan cases 88A, 88B and exhaust fan cases 90A, 90B are provided for supporting the respective clustered elements 33A, 33B. The space between the intake fan cases 88A, 88B is physically partitioned by the respective surfaces on the cases 88A, 88B, and similarly, the space between the exhaust fan cases 90A, 90B is physically partitioned by the respective surfaces on the cases 90A, 90B (To illustrate this, the clustered element 33B and members 88B, 90B related thereto are indicated by a dotted line). The intake fan cases 88A, 88B, for example, extend to the vicinity of the backplane 23, and the insides of the intake fan cases 88A, 88B constitute air passageways. In accordance with a constitution such as this, air travels separately along the inside of the respective intake fan cases 88A, 88B up to the vicinity of the backplane 23, and the air that traveled separately cools the clustered elements 33A, 33B, and the post-cooling air travels separately along the exhaust fan cases 90A, 90B, and is discharged via the exhaust fans 21.

Also, for example, the flow of air to each of the clustered elements 33A, 33B can also not be partitioned. In this case, even if one of the clustered elements 33A fails, the constitution can be such that the driving of the fans 9 and/or 21 supporting this clustered element 33A is not stopped. This makes it possible to suppress the deterioration of cooling efficiency of the logic boards 25 in the other clustered element 33B. Or, in this case, if the one clustered element 33A malfunctions, the driving of the fans 9 and/or 21 supporting this clustered element 33A can be stopped. When the driving of the fans 9 and/or 21 supporting the one clustered element 33A is stopped, the environment monitoring unit 320 can increase the driving quantity of the fans 9 and/or 21 supporting the other clustered element 33B (For example, increase the number of revolutions per unit of time.).

A number of embodiments of the present invention have been explained above, but these are examples for explaining the present invention, and do not purport to limit the scope of the present invention to only these embodiments. The present invention can also be put into practice in a variety of other aspects.

For example, a variety of cooling devices for use in air cooling can be used instead of fans.

Figure 15B:
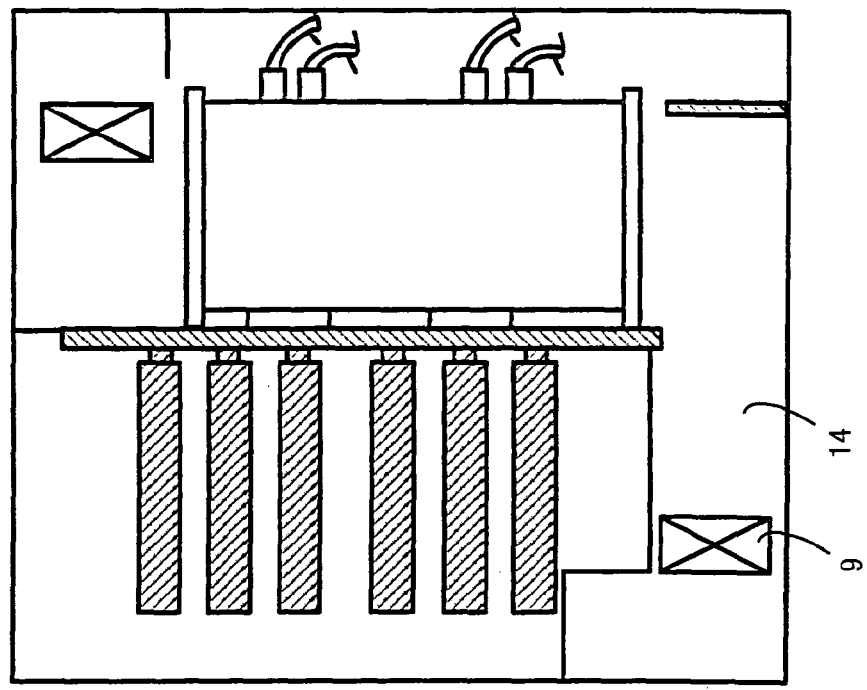
FIG. 15B is a diagram showing another variation of the constitution of an air sub-passageway 14.
Figure 15A:
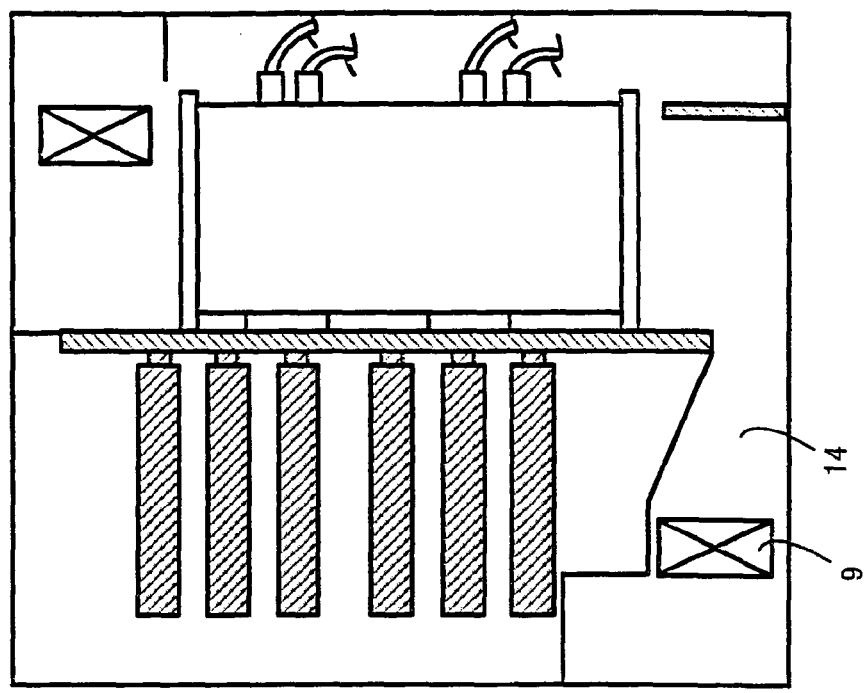
FIG. 15A is a diagram showing one variation of the constitution of an air sub-passageway 14.

Further, for example, the height of the air sub-passageway 14, for example, can be fixed at substantially the same height as the height of the intake fans 9 from the intake fans 9 to the backplane 23 as illustrated in FIG. 15A. Further, instead of this, for example, when the distance between the bottom edge of the backplane 23 and the bottom of the logic portion is shorter than the height of the intake fan 9 as illustrated in FIG. 15B, the height of the air sub-passageway 14 can steadily become lower from the location of the intake fans 9 to the location of the backplane 23.

Further, for example, the logic portion 5 does not necessarily have to be in the bottommost part of the storage control apparatus 1, and, for example, can be in the uppermost location instead.

What is claimed is:

1. A storage control apparatus equipped with a logic board for carrying out storage control, said storage control apparatus comprising:
   a storage portion including a plurality of storage devices;
   a vertical logic board, wherein said vertical logic board resides externally of the storage portion and controls access to the storage devices in the storage portion;
   a cooling mechanism constituted such that air taken in from the front of said storage control apparatus travels to the rear side of said storage control apparatus and then rises up, said risen air rises further while cooling said vertical logic board, and said risen air is discharged from the rear of said storage control apparatus, and
   multiplexed logical groups,
   wherein each logical group has one or more of said logic boards,
   wherein at least two of the multiplexed logical groups are capable of carrying out the same processing,
   wherein said cooling mechanism comprises at least one of a plurality of intake sources driven to take in air from the front of said storage control apparatus, and a plurality of exhaust sources driven to discharge air from the rear of said storage control apparatus, and
   wherein each of said plurality of intake sources or each of said plurality of exhaust sources, or both, corresponds to at least one of said multiplexed logical groups, and by virtue of hardware in the circuit design or software, when trouble occurs in a certain logical group of said multiplexed logical groups, and that said certain logical group closes down a stoppage of the driving of the intake source or exhaust source corresponding to said certain logical group is carried out another one of said multiplexed logical groups continues the processing that was being performed by said certain logical group in which trouble occurred, and the rotational speed of said intake source or exhaust source corresponding to at least one of said multiplexed logical groups other than said certain logical group is increased.

2. The storage control apparatus according to claim 1, wherein said cooling mechanism comprises:
   an inlet provided in the front of said storage control apparatus;
   an outlet provided in the rear of said storage control apparatus; and
   an air passageway extending from said inlet to said outlet,
   wherein said air passageway comprises a first air sub-passageway, which extends from said inlet to a position lower than the bottom edge of the logic board; a second air sub-passageway, which continues from the end of the first air sub-passageway to either a position at the top edge of the logic board or higher via the surface of said logic board; and a third air sub-passageway, which continues from the end of the second air sub-passageway to said outlet.

3. The storage control apparatus according to claim 2, wherein the part of said second air sub-passageway, which passes through the surface of said logic board, substantially covers the entire surface of said logic board.

4. The storage control apparatus according to claim 1, further comprising:
   a backplane, which is a circuit board that divides said storage control apparatus into a front side and a rear side, wherein said logic board is connected to said backplane from the rear side of said storage control apparatus in a vertical state.

5. The storage control apparatus according to claim 1, wherein said cooling mechanism comprises:
an inlet provided in the front of said storage control apparatus;
an outlet provided in the rear of said storage control apparatus; and
an air passageway, which extends from said inlet to said outlet;
wherein at least one of said plurality of intake sources is provided either in said inlet or in the vicinity thereof, and at least one of said plurality of exhaust sources is provided either in said outlet or in the vicinity thereof.

6. The storage control apparatus according to claim 1, further comprising:
a velocity adjustment member for adjusting the velocity of the air at a specified location of said logic board.

7. The storage control apparatus according to claim 6, wherein said velocity adjustment member is a velocity resistance member for suppressing the velocity of the air, and said velocity resistance member is provided at the back side of said logic board, and in at least one of a location that is higher than the top edge of said logic board or a location that is lower than the bottom edge of said logic board.

8. The storage control apparatus according to claim 7, wherein said velocity resistance member is a plate having one or a plurality of holes formed thereon.

9. The storage control apparatus according to claim 7, further comprising:
a positioning member for positioning said logic board, wherein said velocity resistance member is mounted to said positioning member.

10. The storage control apparatus according to claim 7, wherein said velocity resistance member is a guiding member for causing the air traveling from the front to said rear side of said storage control apparatus to rise up from a certain location toward said logic board.

11. The storage control apparatus according to claim 10, wherein said guiding member is mounted in the vicinity of said certain location at a prescribed height from the bottom of the passageway along which the air flows, and thereby the air from said front separates above and below said guiding member, and the air that separated upwardly rises toward said logic board, and the air that separated downwardly passes below said guiding member and travels further toward said rear side, and
wherein said prescribed height is determined in accordance with the amount of at least one of the air of the upper side and the air of the lower side, which are divided by said guiding member.

12. The storage control apparatus according to claim 1, wherein
either a part or a whole of a passageway for the air, which is taken in from the front of said storage control apparatus and discharged from the rear of said storage control apparatus, is partitioned for each of said logical groups.

13. A storage control apparatus, comprising:
a storage portion including a plurality of storage devices;
a logic portion including a plurality of multiplexed logical groups, each logical group having one or more of a plurality of logic boards, each logic board having a cache memory, and at least two of the multiplexed logical groups being capable of carrying out the same processing;
a backplane, which is a circuit board that divides said logic portion into its front side and rear side, wherein each of said logic boards is connected to said backplane in a vertical state from the rear side of said logic portion, and wherein said logic portion resides externally of the storage portion and controls access to the storage devices in the storage portion via the backplane; and
a cooling mechanism constituted such that air taken in from the front side of said logic portion travels to the rear side of said logic portion and then rises up, said air rises further while cooling said logic boards, and said risen air is discharged from the rear of said logic portion;
wherein said cooling mechanism comprises at least one of a plurality of intake sources driven to take in air from the front side of said logic portion, and a plurality of exhaust sources driven to discharge air from the rear side of said logic portion, and
wherein each of said plurality of intake sources or each of said plurality of exhaust sources, or both, corresponds to at least one of said multiplexed logical groups, and by virtue of software, when trouble occurs in a certain logical group of said multiplexed logical groups and that said certain logical group closes down, a stoppage of the driving of the intake source or exhaust source corresponding to said certain logical group is carried out, and another one of said multiplexed logical groups continues the processing that was being performed by said certain logical group in which trouble occurred.

14. A storage control apparatus provided in a housing and equipped with a logic board for carrying out storage control, said storage control apparatus comprising:
a storage portion including a plurality of storage devices and a first cooling mechanism arranged to take air in from a front side thereof and discharge the air from a rear side thereof;
a logic portion having a front side, a rear side, a top portion, and a bottom portion, and including a plurality of multiplexed logical groups, each logical group having one or more of a plurality of logic boards and a backplane, which is a circuit board that divides said logic portion into its front side and rear side, wherein each of said logic boards is connected in a vertical state to said backplane from the rear side of said logic portion, wherein at least two of the multiplexed logical groups are capable of carrying out the same processing, and wherein said logic portion resides externally of the storage portion in the storage apparatus housing and controls access to the storage devices in the storage portion via the backplane;
a second cooling mechanism separate from said first cooling mechanism and constituted such that air taken in from an inlet at the bottom of the front side of said logic portion travels to an outlet at the rear side of said logic portion through a first air sub-passageway which extends below said storage portion from said inlet to said backplane, and then rises up through a second air sub-passageway which continues from the end of the first air sub-passageway along said backplane while cooling said logic boards, and then passes through a third air sub-passageway which continues from the end of the second air sub-passageway to the outlet at the rear of said logic portion, wherein said second cooling mechanism comprises a plurality of first fan groups each having at least one first fan driven to take in air from the inlet at the bottom portion of the front side of said logic portion, and a plurality of second fan groups each having at least one second fan driven to discharge air from the outlet at the top portion of the rear side of said logic portion; and a partition wall at the rear side of the logic portion and spaced apart from an external wall of the storage control apparatus housing, said partition wall being arranged to direct air flowing through the first air sub-passageway into the second air sub-passageway;

wherein each of said plurality of first fan groups or each of said plurality of second fan groups, or both, corresponds to at least one of said multiplexed logical groups, and by virtue of hardware in the circuit design or software, when trouble occurs in a certain logical group of said multiplexed logical groups and that said certain logical group closes down, a stoppage of the driving of the first fan group or second fan group corresponding to said certain logical group is carried out, and another one of said multiplexed logical groups continues the processing that was being performed by said certain logical group in which trouble occurred.

* * * * *